(12) United States Patent
Yeo

(10) Patent No.: US 6,281,054 B1
(45) Date of Patent: Aug. 28, 2001

(54) SOI DEVICE AND METHOD FOR FABRICATING THE SAME

(75) Inventor: In Seok Yeo, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/714,690

(22) Filed: Nov. 16, 2000

Related U.S. Application Data

(62) Division of application No. 09/472,568, filed on Dec. 27, 1999, now Pat. No. 6,180,985.

(30) Foreign Application Priority Data

Dec. 30, 1998 (KR) .................................................. 98-61863

(51) Int. Cl.⁷ .............................. H01L 21/00; H01L 21/76
(52) U.S. Cl. ......................... 438/149; 438/404; 438/413; 257/347
(58) Field of Search ..................................... 438/149, 404, 438/413, 242, 243, 386, 479, 517, 282, 298, 910, 151, 488, 523; 257/347, 327, 544

(56) References Cited

U.S. PATENT DOCUMENTS 6,118,152 * 9/2000 Yamaguchi et al. .................. 257/347

* cited by examiner

Primary Examiner—Olik Chaudhuri
Assistant Examiner—Theresa T. Doan
(74) Attorney, Agent, or Firm—Ladas & Parry

(57) ABSTRACT

A SOI device, comprising: a SOI wafer having a stack structure of a silicon substrate, a buried oxide layer having a first and a second contact holes and a silicon layer; an isolation layer formed in the silicon layer to define a device formation region;

a transistor including a gate formed over the device formation region of the silicon layer defined by the isolation layer, source and drain regions formed at the both side of the gate in the device formation region, and a channel region which is a portion of the device formation region between the source and drain region; a conduction layer being contacted with the buried oxide layer; an impurity region for well pick-up formed in the silicon layer to be contacted with the buried oxide layer; a first contact layer formed within the first contact hole of the buried oxide layer to electrically connect the channel region of the transistor and the conduction layer; and a second contact layer formed with the second contact hole of the buried oxide layer to electrically connect the impurity region for well pick-up and the conduction layer.

9 Claims, 3 Drawing Sheets

SOI DEVICE AND METHOD FOR FABRICATING THE SAME

This application is a division of U.S. Ser. No. 09/472,568 filed Dec. 27, 1999, which U.S. application is hereby incorporated herein by reference now U.S. Pat. No. 6,180,985.

BACKGROUND OF THE INVENTION

This invention relates to a silicon-on insulator(SOI) device and a method for fabricating the same, and more particularly to a SOI device and a method for fabricating the same capable of obtaining the stable operation performance.

With high integrity and high performance of semiconductor devices, the semiconductor integration technology using SOI wafer instead of single crystal Si wafer being comprised of a bulk silicon has been proposed. It is because the devices fabricated into the SOI wafer have advantages of high speed due to low junction capacitance, low voltage driving due to low threshold voltage and decrease in latch-up due to complete device isolation as compared with those fabricated in the single crystal Si wafer.

The SOI wafer has a stack structure of a silicon substrate for supporting means, a silicon layer for providing a device formation region and a buried oxide layer for a bonding medium sandwiched between the silicon substrate and the silicon layer. There are a separation by implanted oxygen (SIMOX) method and a bonding method as a SOI wafer fabrication method.

FIG. 1 is a sectional view illustrating a SOI device in the prior art. A SOI wafer 10 having a stack structure of a silicon substrate 1, a buried oxide layer 2 and a silicon layer 3 is prepared. An isolation layer 4 is formed in the silicon layer 3 to define a device formation region. The isolation layer 4 is contacted with the buried oxide layer 2 to provide a complete isolation. A gate 6 including a gate oxide 5 is formed over the device formation region of the silicon layer 3 defined by the isolation layer 4 by a conventional process. A source region 7 and a drain region 8 are formed in the device formation region of the silicon layer 3 to be contacted with the buried oxide layer 2. A portion of the silicon layer between the source region 7 and the drain region 8 is a channel region 9.

In the SOI device, the junction regions such as source and drain regions 7 and 8 are contacted with the buried oxide layer 2 and the depletion region below the junction regions are removed, so that the capacitance in the junction region is reduced and it accomplishes the high speed of the device.

However, the prior SOI device has a poor operation performance due to floating body effect. That is, the body of a transistor formed in the SOI wafer floats from the silicon substrate and the charges are accumulated in the channel region below the gate in operation of the transistor. The operation performance of the transistor becomes unstable due to the accumulated charges.

On the other hand, so as to prevent floating body effect, a region for connecting the body of the transistor to a ground terminal for supplying a substrate bias, is formed in the SOI device. A predetermined voltage is applied from the ground terminal to the channel region and it prevents the charges from accumulating the channel region in the transistor operation. However, because the prior method has need of additional dimension for forming the region for connecting the body of the transistor to the ground terminal in every unit cell, it is not applicable to the high integration device.

SUMMARY OF THE INVENTION

It is an object of the present invention to provide a SOI device and a method of fabricating the same capable of obtaining the stable operation performance.

According to an aspect of the present invention, there is provided to a SOI device, comprising: a SOI wafer having a stack structure of a silicon substrate, a buried oxide layer having a first and a second contact holes and a silicon layer; an isolation layer formed in the silicon layer to define a device formation region; a transistor including a gate formed over the device formation region of the silicon layer defined by the isolation layer, source and drain regions formed at the both side of the gate in the device formation region and a channel region which is a portion of the device formation region between the source and drain region; a conduction layer being contacted with the buried oxide layer; an impurity region for well pick-up formed in the silicon layer to be contacted with the buried oxide layer; a first contact layer formed within the first contact hole of the buried oxide layer to electrically connect the channel region of the transistor and the conduction layer; and a second contact layer formed within the second contact hole of the buried oxide layer to electrically connect the impurity region for well pick-up and the conduction layer.

There is also to provide a method for fabricating a silicon on insulator (SOI) device, comprising the steps of: preparing a silicon substrate; forming a conduction layer in the silicon substrate; forming a buried oxide layer having a first and a second contact holes on the silicon substrate including the conduction layer; forming a first and a second contact layers within the first and the second contact holes in the buried oxide layer, respectively to contact with the conduction layer; forming a silicon layer over the buried oxide layer including the first and the second contact layers; forming an isolation layer in the silicon layer to define a device formation region; forming a gate on the device formation region of the silicon layer over the first contact layer; forming a source region and a drain region at the both side of the gate in the device formation region and forming an impurity region for well pick-up formed in the silicon layer to be contacted with the second contact layer.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
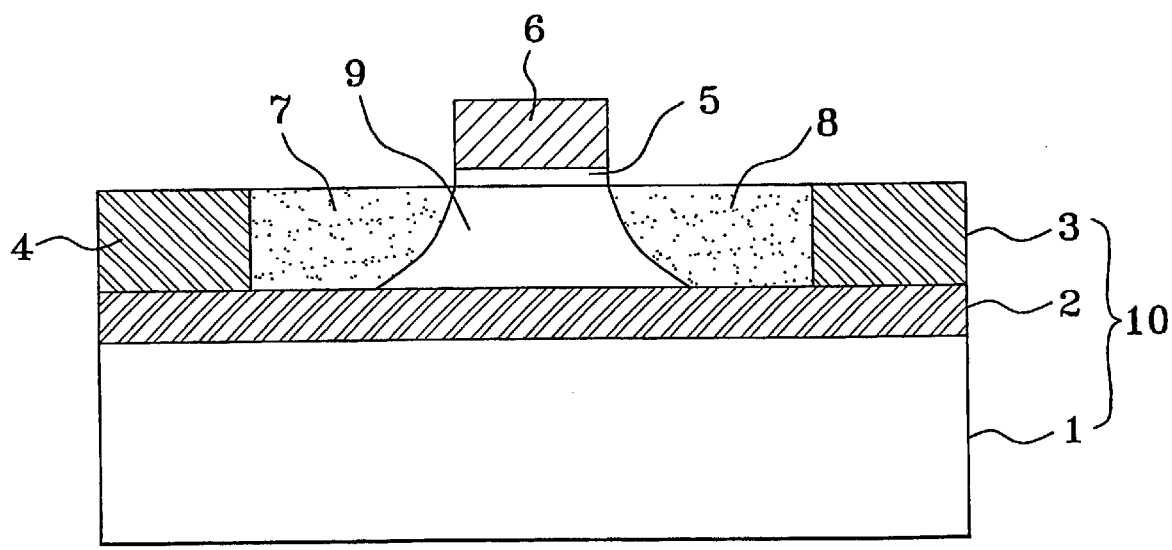
FIG. 1 is a sectional view illustrating a SOI device in the prior art.
Figure 2A:
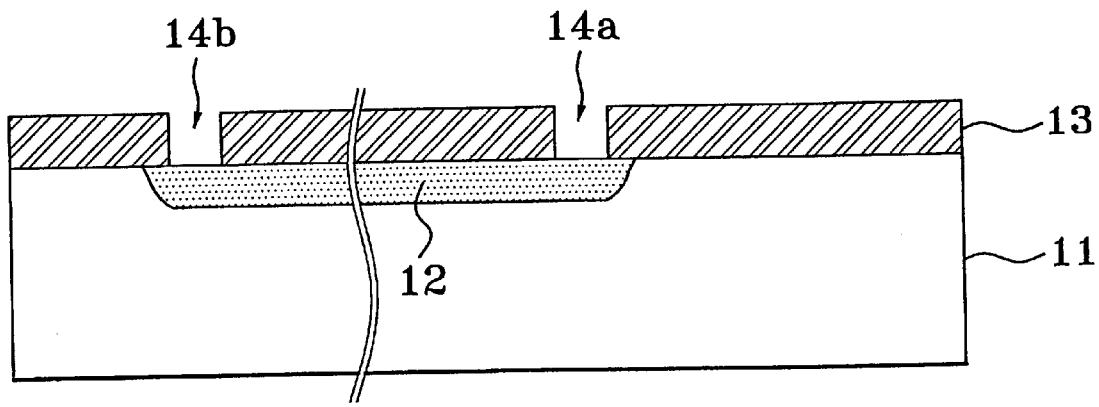
FIG. 2A to FIG. 2C are sectional views illustrating a method for fabricating a SOI device in accordance with an embodiment of the present invention.

Referring to FIG. 2A, a silicon substrate 11 being comprised of a bulk Si is prepared and the a conduction layer 12 having selected depth and width is formed in a surface of the silicon substrate 11 by implanting boron ions or phosphorus ions into the surface of the substrate with a dose of $1 \times 10^{14}$–$1 \times 10^{6}$ ions/cm$^2$. As the conduction layer 12, a doped polysilicon pattern may be formed. At this time, a doped polysilicon layer is formed on the substrate 11 and then patterned to form the polysilicon pattern. Following the polysilicon pattern formation, a planarizing layer is formed over the substrate 11 and then flowed to expose a surface of the polysilicon pattern so as to planarize.

A buried oxide layer 13 is formed over the substrate 11 including the conduction layer 12 at a thickness of 2,000–5,000 Å with thermal oxidation or chemical vapor deposition (CVD). The buried oxide layer 13 is etched by a conventional photolithography process to form a first and a second contact holes 14a and 14b, thereby exposing the conduction layer 12. Herein, the first contact hole 14a is formed to be disposed below a channel region of a transistor which is to be formed in the following process and the second contact hole 14b is formed to be disposed below an impurity region for well pickup for electrically connecting to a ground terminal which is to be formed in a peripheral region in the following process.

Figure 2B:
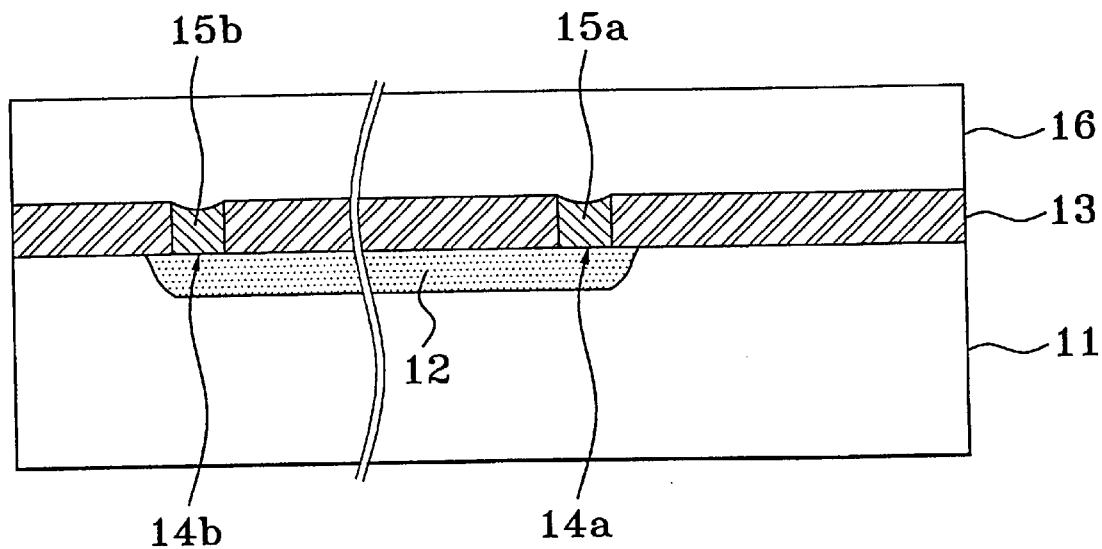

Referring to FIG. 2B, a first and a second contact layers 15a and 15b are formed within the first and second contact holes 14a and 14b, respectively. The first and second contact layers 15a and 15b are comprised of a doped single crystal silicon or polysilicon formed by a selective epitaxial growth. The doped single crystal silicon or the doped polysilicon is doped with impurities during epitaxial growth or it is grown and then ion implanted with impurities.

A silicon layer 16 for providing a device formation region is formed over the buried oxide layer 13 including the first and second contact layers 15a and 15b. The silicon layer 16 is formed by bonding another silicon substrate being comprised of a bulk Si to the buried oxide layer 13 and then polishing the silicon substrate.

Figure 2C:
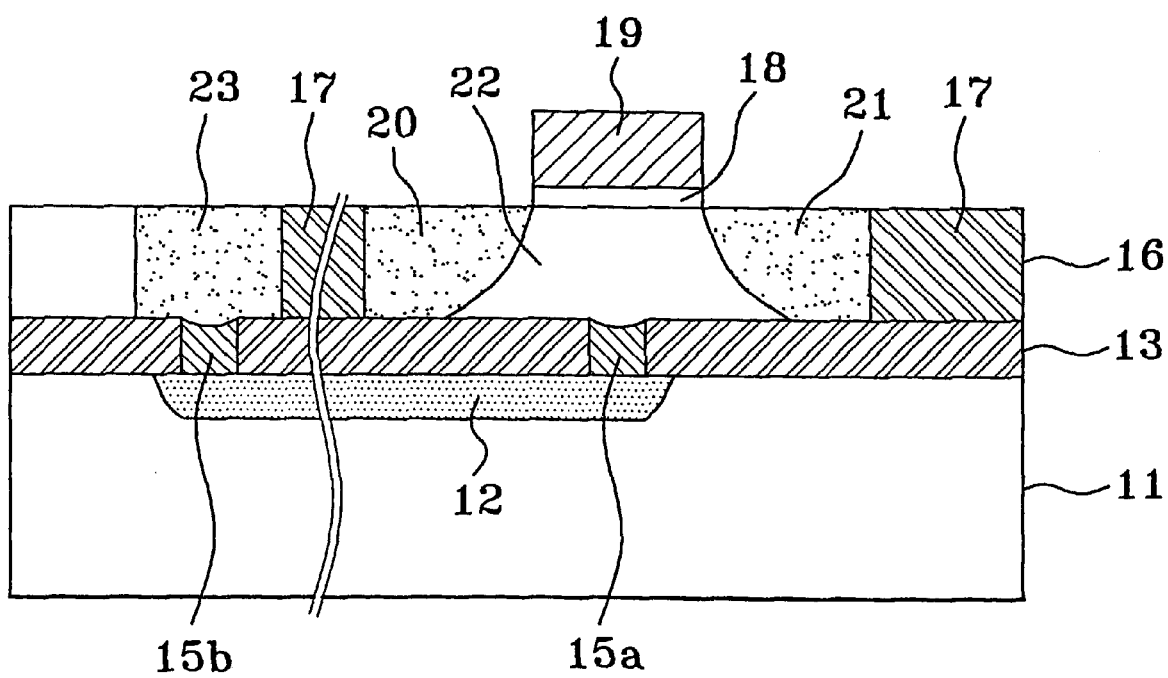

Referring to FIG. 2C, an isolation layer 17 is-formed in the silicon layer 16 to be contacted with the buried oxide layer 13 to define a device formation region. A gate 19 including a gate oxide layer 18 is formed over the device formation region of the silicon layer 16. A source and a drain regions 20 and 21 are formed to contact with the buried oxide layer 13 in the device formation region of the silicon layer 16 at the both side of the gate 19 with ion implantation process using the gate 19 as a mask, thereby fabricating a transistor in a SOI wafer. A portion of the silicon layer between the source and the drain regions 20 and 21 is a channel region 22. A body of the transistor including the channel region 22 is contacted with the first contact layer 15a having a selected conductivity.

An impurity region 23 for well pick-up is formed in the silicon layer of a peripheral region by ion implanting impurities having an opposite conductivity to the source region 20 so as to be contacted with the isolation layer 17 and the buried oxide layer 13. The impurity region 23 is to be electrically connected with the ground terminal (not shown) and is electrically connected with the body of the transistor including the channel region 22 through the first and second contact layers 15a and 15b and the conduction layer 12. At this time, only one impurity region 23 for well pick-up is formed over all unit cells. It is because the bodies of the transistors included in the unit cells are electrically connected to the conduction layer 12 through the conduction layer, so that a predetermined bias can be applied to the channel regions of the transistors in unit cells through the impurity region for well pick-up.

According to the present invention, the bodies of all the transistor formed in the SOI wafer are electrically contacted to the conduction layer through the first contact layer which is electrically connected to the bodies of the transistors and the conduction layer 12 is electrically connected to the impurity region for well pick-up which is connected to a ground terminal through the second contact layer. Therefore, a predetermined bias for preventing charges from accumulating can be applied to the body of the respective transistors through the first and second contact layers and the conduction layer, thereby obtaining the stable operation characteristics.

Furthermore, only one impurity region for well pick-up for applying a predetermined bias to the bodies of all the transistors is formed over all unit cells so that this invention can be applicable to fabrication of the high integration devices.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a silicon on insulator (SOI) device, comprising the steps of:

preparing a silicon substrate;

forming a conduction layer in the substrate;

forming a buried oxide layer having a first and a second contact holes over the silicon substrate including a conduction layer;

forming a first and a second contact layers within the first and the second contact holes of the buried oxide layer, respectively to contact with the conduction layer;

forming a silicon layer over the buried oxide layer including the first and the second contact layers;

forming an isolation layer in the silicon layer to define a device formation region;

forming a gate on the device formation region of the silicon layer over the first contact layer;

forming a source region and a drain region at the both side of the gate in the device formation region; and forming an impurity region for well pick-up in the silicon layer to be contacted with the second contact layer.

2. The method as claimed in claim 1, wherein the conduction layer is formed in a surface of the silicon substrate by ion implanting any ones of boron ions or phosphorus ions in the silicon substrate.

3. The method as claimed in claim 2, wherein a dose of the implanted ion is $1 \times 10^{14} - 1 \times 10^{16}$ ions/cm$^2$.

4. The method as claimed in claim 1, wherein the conduction layer is comprised of a polysilicon pattern.

5. The method as claimed in claim 4, after the conduction layer formation step, further comprising the steps of; depositing a planarization layer over the silicon substrate; and flowing the planarization layer to expose the polysilicon pattern.

6. The method as claimed in claim 1, wherein the buried oxide layer is formed by any one of thermal oxidation or chemical vapor deposition.

7. The method as claimed in claim 1, wherein the first and second contact layers are comprised of doped single crystal silicon or doped polysilicon formed by selective epitaxial growth.

8. The method as claimed in claim 1, wherein the impurity region for well pick-up is formed in the silicon layer of a peripheral region.

9. The method as claimed in claim 1, wherein the impurity region for well pick-up has an opposite conductivity to the source region.

* * * * *